US011424168B2

(12) United States Patent
Mikami et al.

(10) Patent No.: US 11,424,168 B2
(45) Date of Patent: Aug. 23, 2022

(54) MANUFACTURING METHOD OF SEMICONDUCTOR DEVICE AND SEMICONDUCTOR MANUFACTURING APPARATUS INVOLVING THICKNESS MEASUREMENTS

(71) Applicant: Mitsubishi Electric Corporation, Tokyo (JP)

(72) Inventors: Kazuaki Mikami, Tokyo (JP); Haruhiko Minamitake, Tokyo (JP); Kazunori Kanada, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/215,612

(22) Filed: Mar. 29, 2021

(65) Prior Publication Data
US 2021/0384087 A1 Dec. 9, 2021

(30) Foreign Application Priority Data
Jun. 4, 2020 (JP) .............................. JP2020-097733

(51) Int. Cl.
| | |
|---|---|
| *H01L 21/66* | (2006.01) |
| *H01L 21/268* | (2006.01) |
| *H01L 27/06* | (2006.01) |
| *H01L 21/67* | (2006.01) |
| *H01L 29/861* | (2006.01) |
| *H01L 29/739* | (2006.01) |

(52) U.S. Cl.
CPC ............ *H01L 22/26* (2013.01); *H01L 21/268* (2013.01); *H01L 21/67115* (2013.01); *H01L 21/67253* (2013.01); *H01L 27/0664* (2013.01); *H01L 29/7397* (2013.01); *H01L 29/8613* (2013.01)

(58) Field of Classification Search
CPC ......... H01L 22/00; H01L 22/20; H01L 22/26; H01L 22/30; H01L 22/32; H01L 22/34; H01L 21/268; H01L 21/67011; H01L 21/67098; H01L 21/67115; B23K 26/00; B23K 26/03; B23K 26/032; B23K 26/034
See application file for complete search history.

(56) References Cited

U.S. PATENT DOCUMENTS

| | | | | |
|---|---|---|---|---|
| 2005/0134865 | A1* | 6/2005 | Schoonewelle | ....... G03F 9/7011 356/601 |
| 2015/0087082 | A1* | 3/2015 | Iyer | ...................... B23K 26/352 438/5 |

FOREIGN PATENT DOCUMENTS

| | | |
|---|---|---|
| JP | 2005-11840 A | 1/2005 |
| JP | 2009-064944 A | 3/2009 |

* cited by examiner

*Primary Examiner* — John P. Dulka
(74) *Attorney, Agent, or Firm* — Studebaker & Brackett PC

(57) ABSTRACT

Provided is a method for manufacturing a semiconductor device utilizing the feature that there are a plurality of semiconductor substrates to measure the thickness thereof, when measuring the thickness of a plurality of semiconductor substrates upon the laser annealing treatment. For each of at least one semiconductor substrate of the plurality of semiconductor substrates, a laser annealing treatment is performed by controlling a laser beam irradiating the semiconductor substrate based on self-thickness data being data of a result of measurement of a thickness of the semiconductor substrate and reference thickness data being data of a result of measurement of a thickness of at least one semiconductor substrate other than the semiconductor substrate among the plurality of semiconductor substrates.

17 Claims, 8 Drawing Sheets

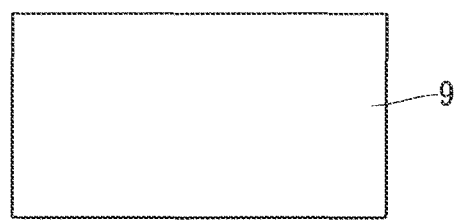
F I G. 4 A
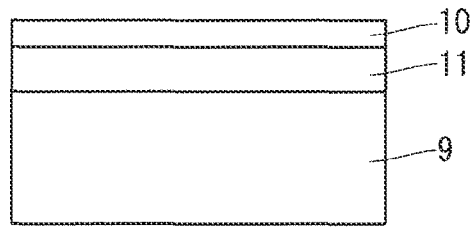
F I G. 4 B
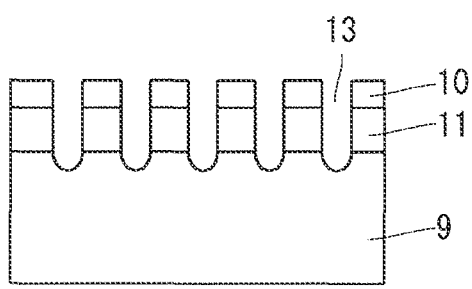
F I G. 4 C
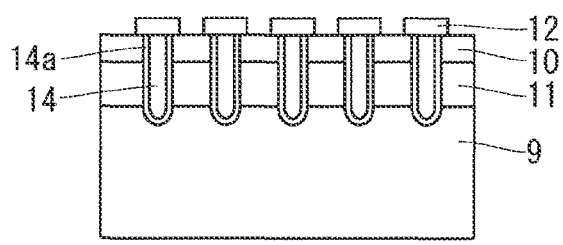
F I G. 4 D
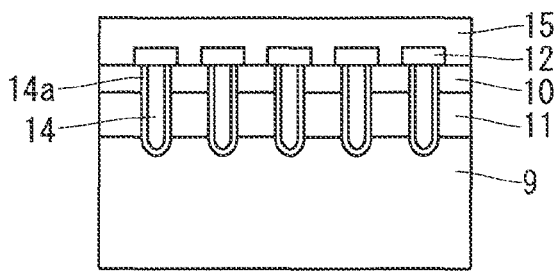
F I G. 4 E
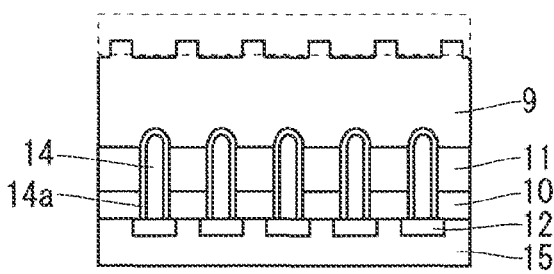
F I G. 4 F
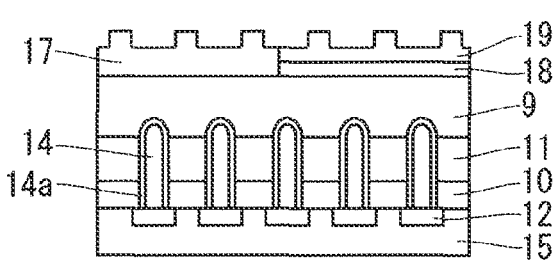
F I G. 4 G
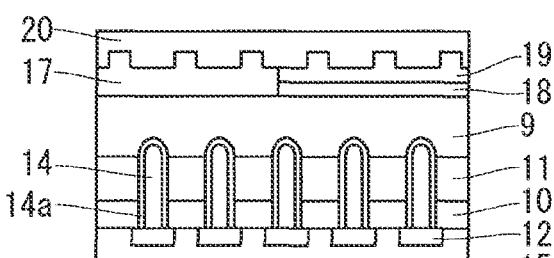
F I G. 4 H
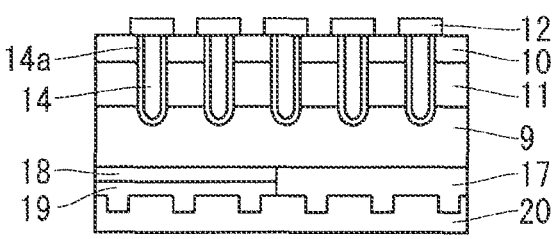
F I G. 4 I

MANUFACTURING METHOD OF SEMICONDUCTOR DEVICE AND SEMICONDUCTOR MANUFACTURING APPARATUS INVOLVING THICKNESS MEASUREMENTS

BACKGROUND OF THE INVENTION

Field of the Invention

The present disclosure relates to a manufacturing method of a semiconductor device and a semiconductor manufacturing apparatus.

Description of the Background Art

The laser annealing step, which is one of the manufacturing steps of a semiconductor device, is a step of locally heating a semiconductor substrate using a laser to activate, for example, a semiconductor layer. In response to the current market demand for low loss, progress is being made in making the thickness of semiconductor substrates thinner. When the thickness is reduced, the difference in heat capacity between the thick portion and the thin portion of the semiconductor substrate becomes remarkable, leading to concerns, for example, of an ununiformed degree of activation in the semiconductor layer.

Japanese Patent Application Laid-Open No. 2009-64944 discloses a method in which, the height of an irradiated object is measured, a database of current values that drives the laser beam corresponding to the thickness of the irradiated object obtained based on the height of the irradiated object is created, and laser annealing with a laser output based on a current value is performed.

SUMMARY

However, in the method of Japanese Patent Application Laid-Open No. 2009-64944, there is room for utilization of a feature that there are a plurality of semiconductor substrates to measure the thickness thereof, when measuring the thickness of a plurality of semiconductor substrates upon the laser annealing treatment.

An object of the present disclosure is to provide a manufacturing method of a semiconductor device utilizing a feature that there are a plurality of semiconductor substrates to measure the thickness thereof, when measuring the thickness of a plurality of semiconductor substrates upon the laser annealing treatment and a semiconductor manufacturing apparatus suitable for the manufacturing method of the semiconductor device utilizing the feature that there are a plurality of semiconductor substrates to measure the thickness thereof, when measuring the thickness of a plurality of semiconductor substrates upon the laser annealing treatment.

In the manufacturing method of a semiconductor device of the present disclosure, the method includes preparing a plurality of semiconductor substrates, and for each of at least one semiconductor substrate of the plurality of semiconductor substrates, performing a laser annealing treatment by controlling a laser beam irradiating the semiconductor substrate based on self-thickness data being data of a result of measurement of a thickness of the semiconductor substrate and reference thickness data being data of a result of measurement of a thickness of at least one semiconductor substrate other than the semiconductor substrate among the plurality of semiconductor substrates.

In the manufacturing method of a semiconductor device of the present disclosure, for each of at least one semiconductor substrate of the plurality of semiconductor substrates, a laser annealing treatment is performed by controlling a laser beam irradiating the semiconductor substrate based on self-thickness data and reference thickness data. Accordingly, the manufacturing method of the semiconductor device of the present embodiment is the manufacturing method of the semiconductor device utilizing the feature that there are a plurality of semiconductor substrates to measure the thickness thereof.

The semiconductor manufacturing apparatus is a semiconductor manufacturing apparatus configured to perform a laser annealing treatment on a semiconductor substrate. The semiconductor manufacturing apparatus of the present disclosure includes a stage configured to hold a semiconductor substrate, an irradiator configured to irradiate the semiconductor substrate held on the stage with laser light, a measurement unit configured to measure the thickness of the semiconductor substrate, and a controller configured to control the irradiator. The controller controls the laser beam based on the self-thickness data being a result of measurement of the thickness of the certain semiconductor substrate measured with the measuring unit and the reference thickness data being a result of measurement of the thickness of at least one semiconductor substrate other than the certain semiconductor substrate measured with the measuring unit at a time of performing the laser annealing treatment on the certain semiconductor substrate.

The controller controls the laser beam based on the self-thickness and the reference thickness at a time of performing the laser annealing treatment on the certain semiconductor substrate. Accordingly, the semiconductor manufacturing apparatus is a semiconductor manufacturing apparatus suitable for the manufacturing method of the semiconductor device utilizing the feature that there are a plurality of semiconductor substrates to measure the thickness thereof, when measuring the thickness of a plurality of semiconductor substrates upon the laser annealing treatment.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4A to 4I are diagrams illustrating states of manufacturing processes of the semiconductor device according to the manufacturing method of the semiconductor device according to Embodiments 1 to 5;

DESCRIPTION OF THE PREFERRED EMBODIMENTS

A. Embodiment 1

<A-1. Configuration>

Figure 6:
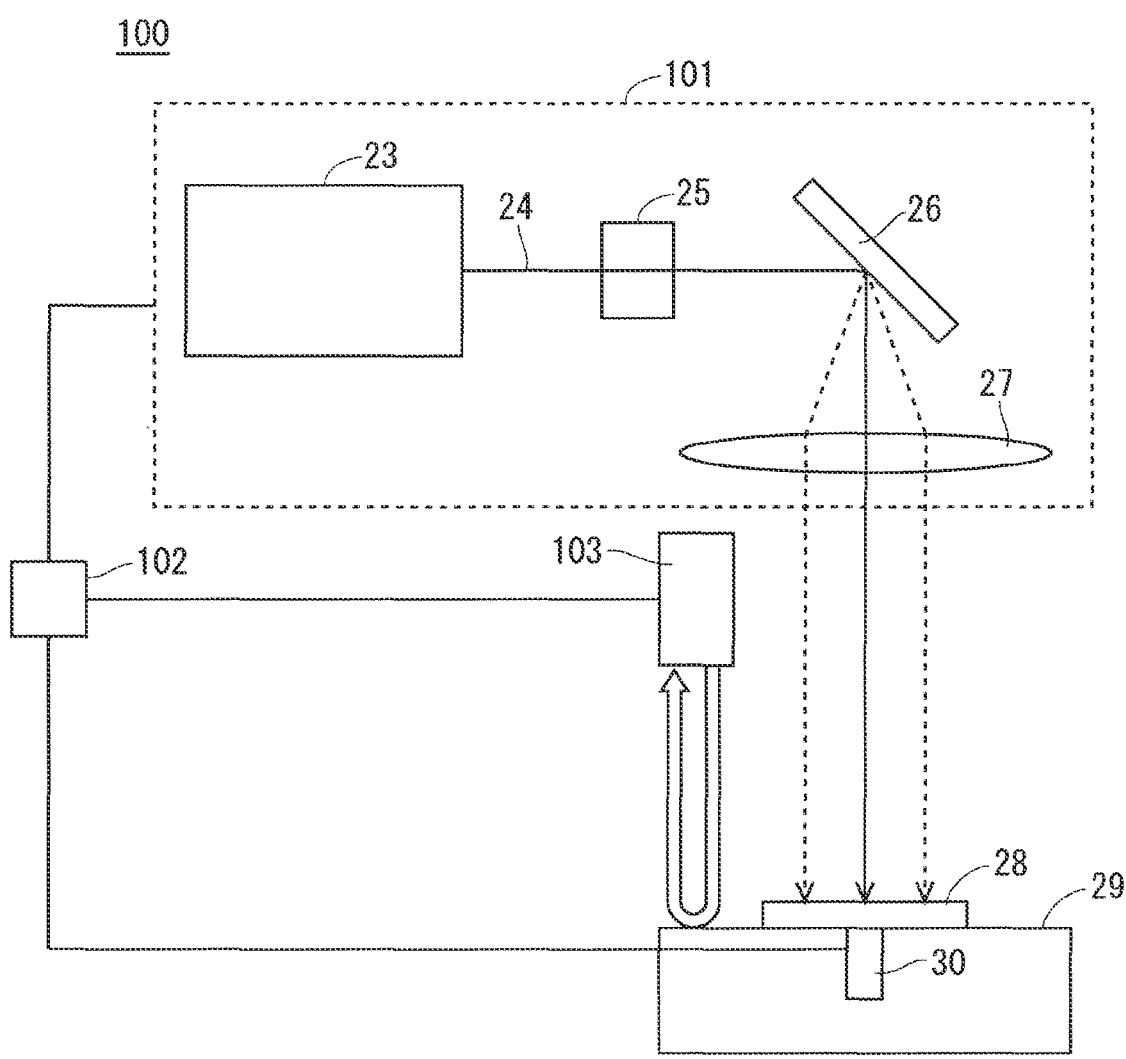
FIG. 6 is a schematic diagram of a semiconductor manufacturing apparatus according to Embodiments 1 to 6.

FIG. 6 is a schematic diagram of a laser annealing apparatus 100 as a semiconductor manufacturing apparatus according to Embodiment 1.

As illustrated in FIG. 6, the laser annealing apparatus 100 includes an irradiator 101, a controller 102, a film thickness meter 103 serving as a measuring unit, and a stage 29. FIG. 6 also illustrates a semiconductor substrate 28 that is not a component of the laser annealing apparatus 100.

The controller 102 controls the irradiator 101 and the film thickness meter 103. The controller 102 is, for example, a central processing unit (CPU) or a microcomputer.

The laser annealing apparatus 100 holds the semiconductor substrate 28 by the stage 29. The stage 29 may be any of a vacuum chuck, an electrostatic chuck, or a mechanical chuck as long as the flatness of the semiconductor substrate 28 is secured. The stage 29 includes an angle adjusting mechanism for adjusting the angle of the semiconductor substrate 28 in the horizontal plane, and a height adjusting mechanism for adjusting the height of the semiconductor substrate 28, that is, the position in the direction perpendicular to the main surface. The angle adjusting mechanism and the height adjusting mechanism are used, for example, for positioning of the semiconductor substrate 28 using an alignment mark on the first-main-surface side of the semiconductor substrate 28, which will be described later.

The stage 29 includes a microscope 30. For example, the microscope 30 measures the position of the alignment mark on the first-main-surface side of the semiconductor substrate 28 which is held on the first-main-surface side thereof by the stage 29 through a protective film 15 formed on the first-main-surface side.

The film thickness meter 103 is, for example, a spectroscopic interference type film thickness meter. Since it is assumed In Embodiment 1, the variation in film thickness is assumed to be between several μm and several tens of μm; therefore, it is desirable that the film thickness meter 103 is capable of sufficiently measuring this range of variation in film thickness.

The irradiator 101 includes a laser oscillator 23, an attenuator 25, a galvanometer mirror 26, and an fθ lens 27. Although, the irradiator 101 further includes a uniform optical system such as a homogenizer for uniformizing the light amount distribution of the transmitting light and a condenser lens, they are omitted in FIG. 6. FIG. 6 illustrates a laser beam 24. The path of the laser beam 24 when the irradiation position of the laser beam 24 on the semiconductor substrate 28 is changed by the galvanometer mirror 26 is illustrated by a broken line in FIG. 6. As illustrated by the broken line in FIG. 6, the irradiator 101 scans the laser beam 24 by the galvanometer mirror 26 and the fθ lens 27 while maintaining the irradiation angle with respect to the semiconductor substrate 28.

The laser annealing apparatus 100 performs the annealing treatment by irradiating the semiconductor substrate 28 held by the stage 29 with the laser beam 24 by the irradiator 101 and scanning the semiconductor substrate 28. As a method of changing the heat input during the laser annealing treatment, it is desirable to use a mechanism of changing the scanning speed by the galvanometer mirror 26, or a mechanism of adjusting the power of the laser beam 24 by the attenuator 25, or both of the mechanisms.

In Embodiment 1, the scanning speed of the laser is assumed to be between several hundred mm/s and several thousand mm/sec; therefore, the response speed required for adjusting the heat input is between several μsec and several msec, and an adjustment mechanism using a highly responsive motor such as the attenuator 25 or galvanometer mirror 26 is desirably adopted. When the galvanometer mirror 26 is used, it is desirable to use it together with the fθ lens 27 in order to correct the irradiation angle of the laser beam 24. When changing the scanning speed at high speed, scanning by the operation of the stage 29 is impractical considering the responsiveness, however, when adjusting the heat input only by the attenuator 25, the laser scanning mechanism by the operation of the stage 29 may be adopted.

<A-2. Manufacturing Method of Semiconductor Device and Operation of Laser Annealing Apparatus>

With reference to FIGS. 4A to 4I, a manufacturing method of the semiconductor device according to Embodiment 1 will be described by taking as an example a manufacturing method of a semiconductor device for manufacturing a Reverse Conducting Insulated Gate Bipolar Transistor (RC-IGBT). Also, an operation of a laser annealing apparatus 100 will be described in the description of the manufacturing method of the semiconductor device.

In the following description regarding the manufacturing method of the semiconductor device, the manufacturing method of an active region of the RC-IGBT is described, and the manufacturing method of a termination region and a gate signal receiving region is omitted.

Figure 1:
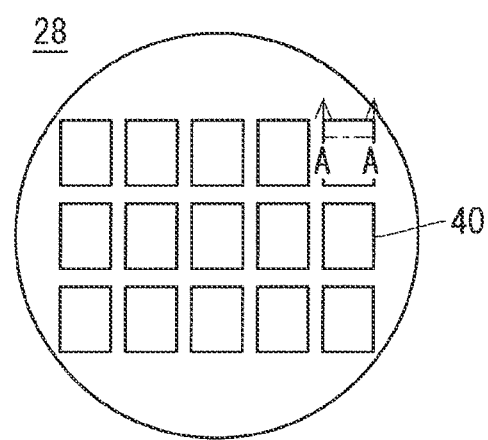
FIG. 1 is a plan view of a semiconductor substrate.

In the manufacturing method of a semiconductor device according to each Embodiment, the semiconductor device is manufactured by using a plurality of semiconductor substrates 28 as one group. At least one semiconductor element 40 is formed on each of a plurality of semiconductor substrates 28 as illustrated in FIG. 1. In the process of manufacturing, the region corresponding to each semiconductor element 40 is referred to a semiconductor element forming region.

Hereinafter, the manufacturing method of a semiconductor device will be described with focusing on the cross section illustrated by the line A-A illustrated in FIG. 1.

Figure 3:
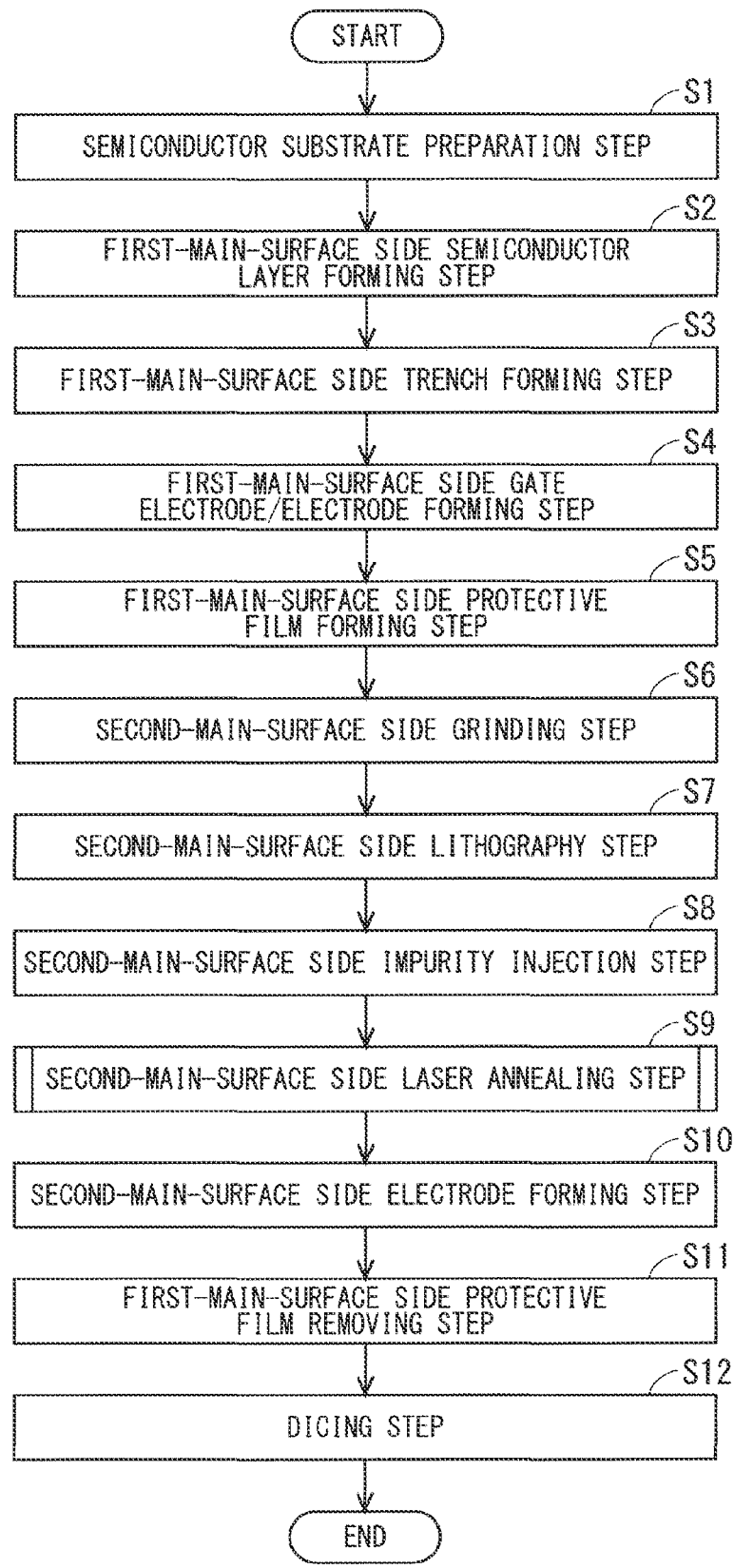
FIG. 3 is a flowchart illustrating a manufacturing method of a semiconductor device according to Embodiments 1 to 5.

FIG. 3 is a flowchart illustrating the manufacturing method of a semiconductor device according to Embodiment 1. The manufacturing method of the semiconductor device according to Embodiment 1 includes a semiconductor substrate preparation step, a first-main-surface side semiconductor layer forming step, a first-main-surface side trench forming step, a first-main-surface side gate electrode/electrode forming step, a first-main-surface side protective film forming step, a second-main-surface side grinding step, a second-main-surface side lithography step, a second-main-surface side impurity injection step, a second-main-surface side laser annealing step, a second-main-surface side electrode forming step, a first-main-surface side protective film removing step, and a dicing step.

In the semiconductor substrate preparation step, a plurality of semiconductor substrates 28 being n-type drift layers 9 illustrated in FIG. 4A are prepared (Step S1). In the following, the semiconductor substrates 28 will be individually described except for the second-main-surface side laser annealing step. Further, the one includes not only the state prepared in step S1 but also the state in which other semiconductor layers, electrodes, and the like are formed on the drift layer 9 in the following manufacturing steps is referred to as a semiconductor substrate 28.

In the first-main-surface side semiconductor layer forming step, ion implantation of donor and acceptor at different depths, respectively, is performed on the first-main-surface side, which is the main surface on one side of the drift layer 9, and heat treatment is performed; therefore, as illustrated in FIG. 4B, a p-type first-main-surface side p layer 10 and an n-type first-main-surface side n layer 11 are formed (Step S2). The impurity concentrations of the first-main-surface side p layer 10 and the n-type first-main-surface side n layer 11 are higher than the impurity concentration of the drift layer 9, respectively. As the donor, for example, arsenic, phosphorus, or the like is used, and as the acceptor, for example, boron, aluminum, or the like is used. By selectively injecting a donor and an acceptor using a mask, a plurality of first-main-surface side p layers 10 and first-main-surface side n layers 11 corresponding to a plurality of semiconductor elements 40 are formed in the same pattern within the surface of the semiconductor substrate 28.

The first-main-surface side trench forming step (Step S3) includes a heating step, an exposure step, and an etching step. In the heating step, an oxide film serving as an etching mask is formed on the first-main-surface side of the semiconductor substrate 28. In the exposure step, a photomask is used to form a shot pattern on the oxide film to obtain an etching mask having an opening. In the etching step, the first-main-surface side of the semiconductor substrate 28 is etched using the etching mask to form trenches 13 having a depth reaching the drift layer 9. In the first-main-surface side trench forming step, the trenches (grooves) 13 are formed on the first-main-surface side as illustrated in FIG. 4C through the heating step, the exposure step, and the etching step.

The first-main-surface side gate electrode/electrode forming step (Step S4) includes a polysilicon deposition step, an etching step, and an electrode metal film forming step. Prior to the polysilicon deposition step, the semiconductor substrate 28 is heated in an oxygen-containing atmosphere to form oxide films 14a on the inner walls of the trenches 13. At that time, an oxide film is also formed on the first main surface of the semiconductor substrate 28. In the polysilicon deposition step, polysilicon doped with n-type or p-type impurities is deposited in the trenched 13 in which the oxide films 14a are formed on the inner walls by chemical vapor deposition (CVD) or the like, and the gate electrodes 14 are formed in the trenches 13. In the etching step, the oxide film formed on the first main surface of the semiconductor substrate 28 is removed by etching. In the electrode metal film forming step, electrodes 12 are formed in a selective regions on the upper side of the first main surface of the semiconductor substrate 28. The semiconductor substrate 28 is in the state illustrated in FIG. 4D by the first-main-surface side gate electrode/electrode forming step. In the first-main-surface side gate electrode/electrode forming step, an alignment mark is pre-formed as a mechanism for positioning when performing the second-main-surface side impurity injection step and the second-main-surface side laser annealing step, which are later steps.

As illustrated in FIG. 4E, in the first-main-surface side protective film forming step, the protective film 15 for suppressing damage on the first-main-surface side is formed (Step S5). The material of the protective film 15 is preferably a tape or polyimide-based material.

In the second-main-surface side grinding step, the first-main-surface side of the semiconductor substrate 28 on which the protective film 15 is formed is adsorbed on the stage of a grinding device, and then grinding is performed so that, for example, the thickness of the semiconductor substrate 28 is 50 µm or less from the second-main-surface side, which is the main surface opposite to the first-main-surface of the semiconductor substrate 28 (Step S6). As illustrated in FIG. 4F, the second-main-surface side grinding step results in a state in which the thickness varies within the surface of the semiconductor substrate 28. In FIG. 4F, the broken line indicates the region of the semiconductor substrate 28 before grinding.

Figure 5A:
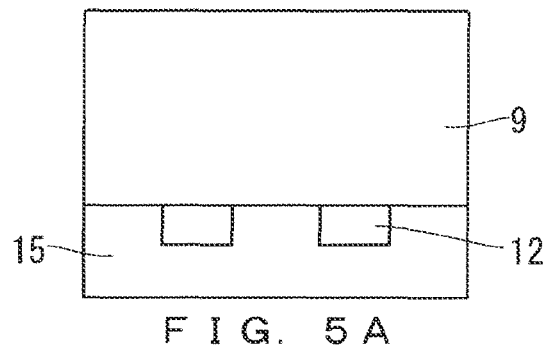
FIGS. 5A to 5C are diagrams illustrating states of manufacturing processes of the semiconductor device according to the manufacturing method of the semiconductor device according to Embodiments 1 to 5.
Figure 5B:
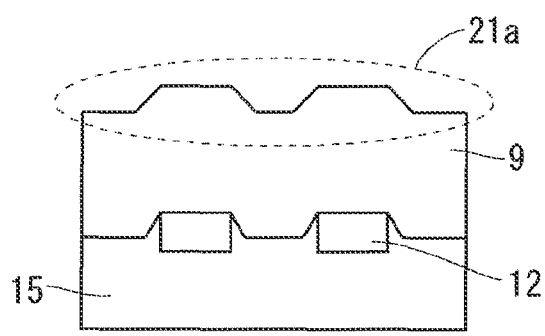
Figure 5C:
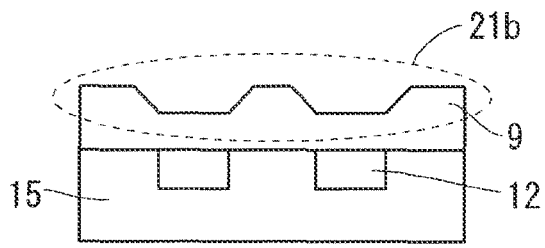

FIGS. 5A to 5C illustrate a process of how variation in thickness is generated within the surface of the semiconductor substrate 28 during grinding in the second-main-surface side grinding process. In FIGS. 5A to 5C, for the sake of simplicity, the first-main-surface side p layer 10, the first-main-surface side n layer 11, the oxide films 14a, and the gate electrodes 14 are assumed to be included in the drift layer 9, and only the drift layer 9, the electrode 12 and the protective film 15 are illustrated. FIG. 5A illustrates the state of the semiconductor substrate 28 before the second-main-surface side grinding process. FIG. 5B illustrates the state of the semiconductor substrate 28 when the first main surface of the semiconductor substrate 28 is adsorbed on the stage of the grinding device (the grinding device is not illustrated). If the thickness of the semiconductor substrate 28 is thin, the influence of the pressure difference between the pressure applied to the region where the base is only the protective film 15 and the pressure applied to the region where the protective film 15 and the electrode 12 are present in the semiconductor substrate 28 becomes large, generating differences in level 21a on the second main surface of the semiconductor substrate 28. When grinding is performed while maintaining the adsorption, the differences in level 21a are scraped off and to be flat. By releasing the adsorption after grinding, differences in level 21b are generated on the second main surface of the semiconductor substrate 28 after the second-main-surface side grinding step as illustrated in FIG. 5C. The differences in level 21b are the unevenness on the second-main-surface side of the semiconductor substrate 28 illustrated in FIG. 4F. A damaged layer remains on the front surface layer on the second-main-surface side of the semiconductor substrate 28 after grinding and the damaged layer is desirably removed by etching.

In the second-main-surface side lithography step (Step S7), a mask is formed on the second-main-surface side.

In the second-main-surface side impurity injection step (Step S8), a donor and an acceptor are injected through the openings of the mask formed in the second-main-surface side lithography step, to form an impurity injection layer serving as an n-type cathode layer 17, an n-type buffer layer 18 and a p-type collector layer 19 (see FIG. 4G). The impurity concentrations of the cathode layer 17, the buffer layer 18, and the collector layer 19 are higher than the impurity concentration of the drift layer 9. As the donor, for example, arsenic, phosphorus, or the like is used, and as the acceptor, for example, boron, aluminum, or the like is used. When a plurality of semiconductor regions are formed in the semiconductor element 40 as in the RC-IGBT, the second-main-surface side lithography step and the second-main-surface side injection step are repeatedly performed.

Figure 8:
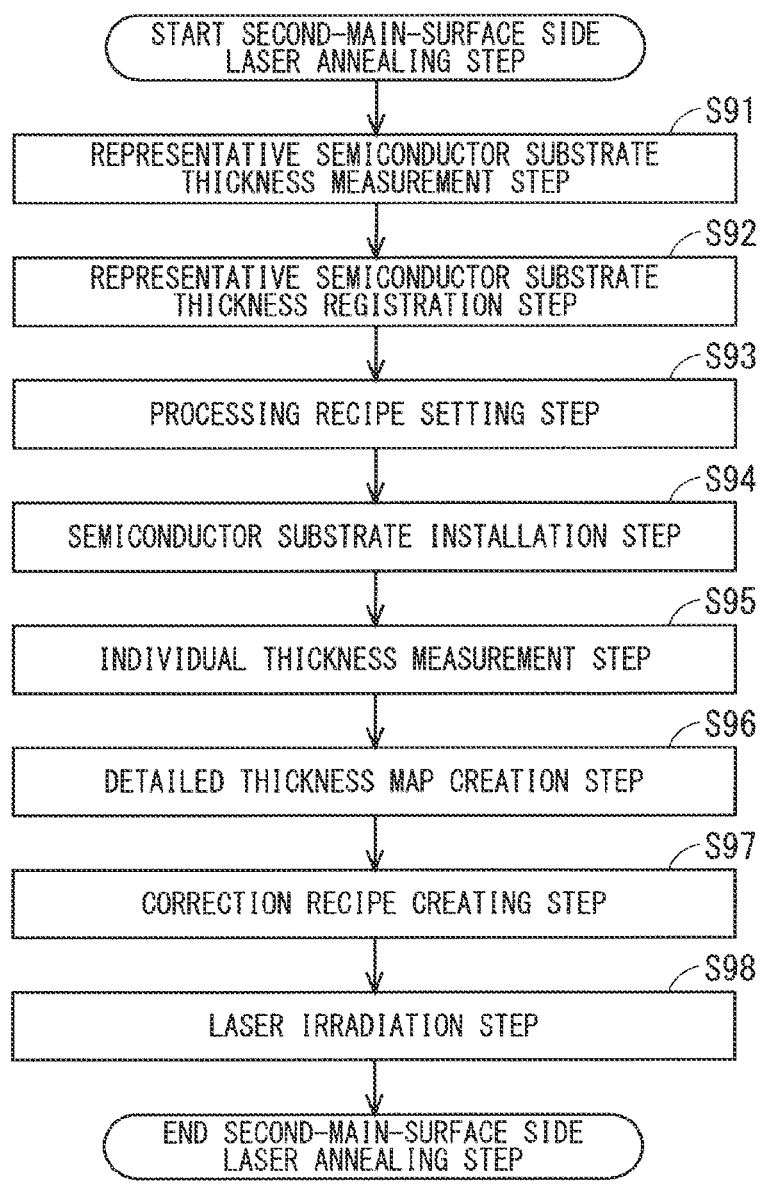
FIG. 8 is a flowchart of a laser annealing treatment according to Embodiments 1 to 5.

In the second-main-surface side laser annealing step (Step S9), the impurities in the impurity injection layer on the second-main-surface side formed in the second-main-surface side impurity injection step are activated. FIG. 8 illustrates a flowchart of the second-main-surface side laser annealing step. As illustrated in FIG. 8, the second-main-surface side laser annealing step includes a representative semiconductor substrate thickness measurement step, a representative semiconductor substrate thickness registration step, a processing recipe setting step, a semiconductor substrate installation step, an individual thickness measurement step, a detailed thickness map creation step, a correction recipe creating step, and a laser irradiation step.

In the following, the second-main-surface side laser annealing step will be described assuming that the laser annealing apparatus 100 is used.

In the second-main-surface side laser annealing step, two types of thickness measurements are performed: a measurement in representative semiconductor substrate thickness measurement step and a measurement in the individual thickness measurement step. Then, for a certain semiconductor substrate 28, the laser annealing treatment is performed in which the laser beam is controlled by the laser irradiation step based on self-thickness data being the result of measuring the thickness of the semiconductor substrate 28 per se at the individual thickness measurement step and reference thickness data being the result of measuring the thickness of at least one semiconductor substrate 28 other than the certain semiconductor substrate 28 at the representative semiconductor substrate thickness measurement step. Although, the thickness of the semiconductor substrate 28 to be measured is, for example, the total thickness including the semiconductor layer and all other parts, when the semiconductor substrate 28 is provided with the metal electrodes 12 and a film covering the metal electrodes 12 such as the protective film 15 as in Embodiment 1, the thickness from which the portion of the metal electrodes 12 and the film covering the metal electrode 12 is excluded may be adopted.

Figure 2A:
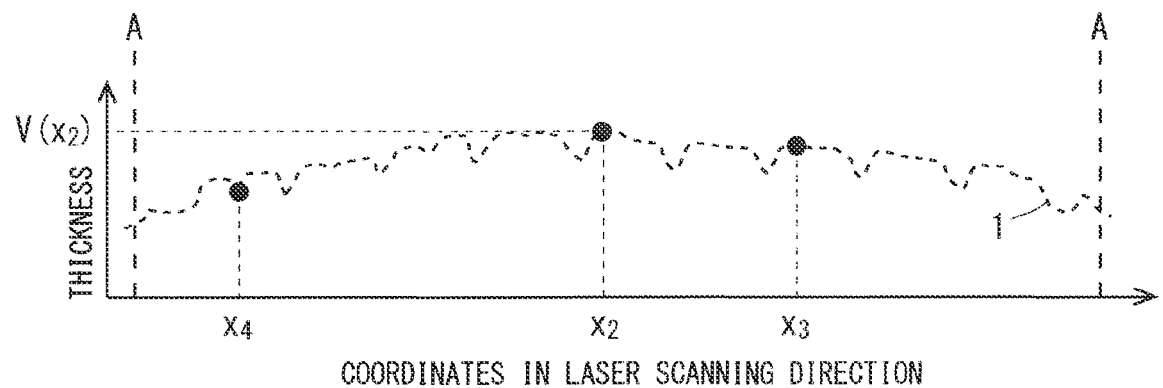
FIGS. 2A to 2D are diagrams schematically illustrating the relationship between the thickness of a semiconductor substrate and the heat input amount in the laser annealing treatment.
Figure 2B:
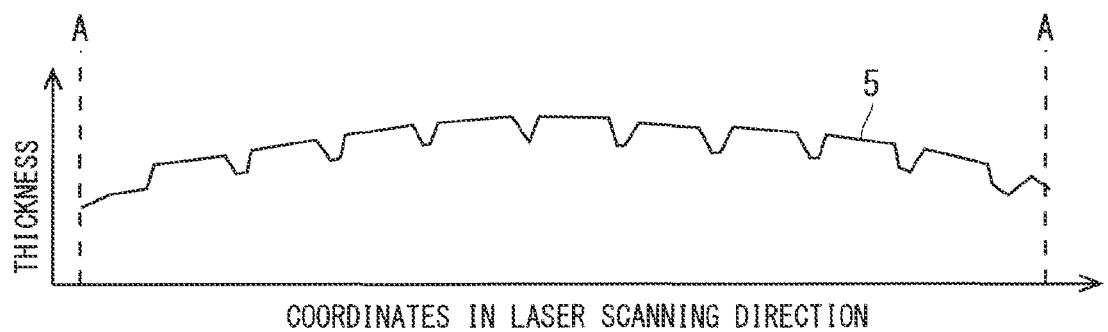

In the representative semiconductor substrate thickness measurement step (Step S91), from a plurality of semiconductor substrates 28 prepared in Step S1, one or a plurality of representative semiconductor substrates 28 are selected, and the thickness of each of the selected representative semiconductor substrates 28 is measured. In this thickness measurement, the thickness of a sufficient number of measurement positions for grasping the variation in the thickness in the substrate surface of the semiconductor substrate 28, for example, the thickness measurement at several thousand or more measurement positions in the substrate surface is performed. In the representative semiconductor substrate thickness measurement step, representative semiconductor substrate thickness information 5 including information on the positions of the differences in level and the amount of the differences in level is created by increasing the number of measurement positions more than that measured in the individual thickness measurement step. Assuming that coordinates of a position where the thickness is measured are $x_i$ (i represents a subscript that specifies the measurement position), the thickness information 5 is given as, for example, the thickness $W(x_i)$ at each $x_1$. Here, the object is to measure the thickness, and laser annealing treatment is not necessary. Giving consideration to the effect of variation of each of the substrates, for example, it is preferable to measure the thicknesses of selected several representative semiconductor substrates 28, to obtain the thickness information 5 as the average thickness distribution in advance. An example of the thickness information 5 at the A-A line of FIG. 1 is illustrated in FIG. 2B. In FIGS. 2A to 2D, the direction along the A-A line is indicates as the scanning direction of the laser. In FIG. 2B, the thickness information 5 is represented as a continuous function assuming that the number of $x_i$s is sufficiently large as well as a smooth function assuming to be the average of a plurality of representative semiconductor substrates 28.

The thickness of the semiconductor substrate 28 is measured with the semiconductor substrate 28 held on the stage 29 such that the first-main-surface side of the semiconductor substrate 28 faces the stage 29 side. The position of the alignment mark on the first-main-surface side of the semiconductor substrate 28 is measured with a microscope 30 through the protective film 15, and the positioning is performed by moving the stage 29 based on the position of the alignment mark.

In the representative semiconductor substrate thickness registration step (Step S92), the thickness information 5 created in the representative semiconductor substrate thickness measurement step is registered in a storage area (not illustrated) of the laser annealing apparatus 100.

In the processing recipe setting step (Step S93), the controller 102 sets a processing recipe that specifies the processing method in Steps S94 to S98 based on the thickness information 5. The processing recipe, for example, specifies the heat input amount at each position of coordinates based on the thickness information 5 as a reference for a later correction recipe. Further, the processing recipe specifies, for example, the thickness measurement position in the individual thickness measurement step. The measurement position is, for example, a position for each semiconductor element forming region, a predetermined position in the central portion of the semiconductor element forming region, or a position selected based on a predetermined standard and the thickness information 5. The position selected based on a predetermined standard and the thickness information 5 is, for example, a position determined to be flat based on the predetermined standard and the thickness information 5. Such selection of the measurement position is performed by, for example, the controller 102 based on a predetermined standard and the thickness information 5. The self-thickness data including data of the result of measurement of the thickness of the position selected based on the predetermined standard and the thickness information 5 enables to obtain the information on the thickness of the semiconductor substrate 28a at a more appropriate location to enhance the accuracy of the detailed thickness map 6 described later.

In the semiconductor substrate installation step (Step S94), the semiconductor substrate 28 is manually transferred to the stage 29 or automatically transferred to the stage 29 by the laser annealing apparatus 100, and the semiconductor substrate 28 is held by the stage 29. In Steps S95 to S98 described later, the target semiconductor substrate 28 will be described as the semiconductor substrate 28a. However, the actual processing may be performed on a plurality of semiconductor substrates 28 at the same time.

In the individual thickness measurement step (Step S95), based on the processing recipe, the controller 102 measures a thickness of the semiconductor substrate 28a at a position for each semiconductor element forming region of the semiconductor substrate 28a, for example, a position determined to be flat based on the predetermined standard and the thickness information 5. The thicknesses are measured at several to several thousand positions in the plane of the semiconductor substrate 28a. FIG. 2A illustrates an example of the actual thickness distribution 1 of the semiconductor substrate 28a on the line A-A of FIG. 1.

Figure 2C:
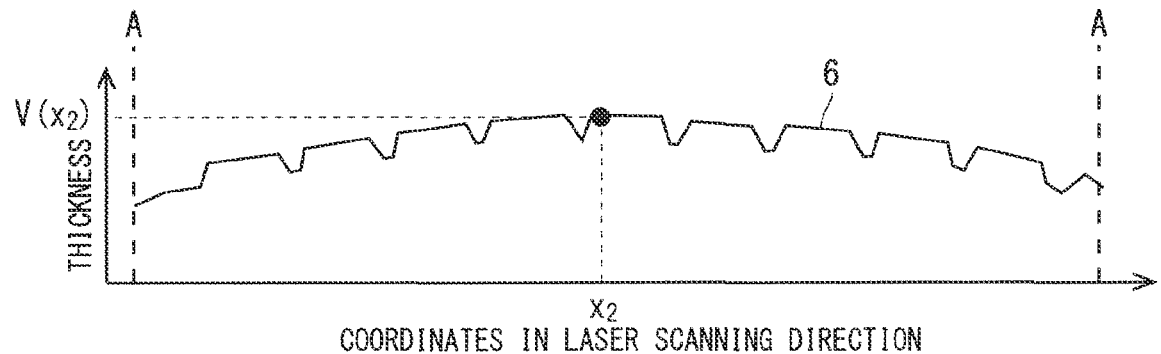

In the detailed thickness map creation step (Step S96), the controller 102 creates a detailed thickness map 6 of the semiconductor substrate 28a based on the thickness measured on the semiconductor substrate 28a in the individual thickness measurement step and the thickness information 5. The detailed thickness map 6 is created by complementing the thickness of the portion of the semiconductor substrate 28a not measured in the individual thickness measurement step with the thickness information 5 acquired in the representative semiconductor substrate thickness measurement step. The detailed thickness map 6 is obtained by comparing, for example, the thickness information 5 with the thickness measured in the individual thickness measurement step for each semiconductor device forming region, and making an adjustment for bringing the deviation of thickness at the coordinates measured in the individual thickness measurement step to zero with respect to the thickness information 5. $U(x_i)=W(x_i)-W(x_2)+V(x_2)$ is established, for example, for a semiconductor device forming area of interest, in which $x_2$ represents the coordinates of the position where the thickness is measured in the individual thickness measurement step, $V(x_2)$ represents the thickness at $x_2$ measured in the individual thickness measurement step, and $U(x_i)$ represents the thickness at each $x_i$ indicated by the detailed thickness map 6. A detailed thickness map 6 on line A-A of FIG. 1 is illustrated in FIG. 2C.

Figure 2D:
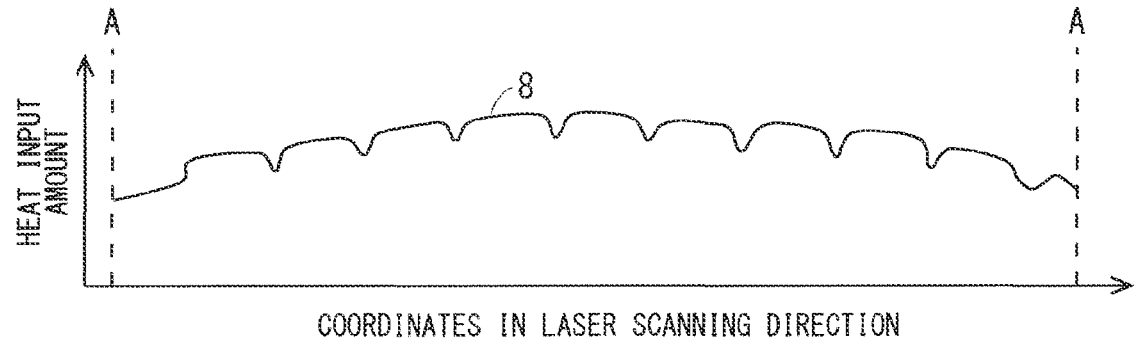

In the correction recipe creating step (step S97), the controller 102 generates a correction recipe for the semiconductor substrate 28a in the controller 102 based on the detailed thickness map 6 for the semiconductor substrate 28a. The correction recipe specifies, for example, the heat input amount 8 at each position of coordinates in the plane of the semiconductor substrate 28a. FIG. 2D illustrates an example of the heat input amount 8 on the line A-A of FIG. 1. The heat input amount 8 can be changed by changing the power of the laser beam and the scanning speed. Further, the correction recipe may be the one specifying not only the heat input amount 8 but also more detailed laser beam irradiation conditions such as the wavelength and profile of the laser beam. The method of generating the heat input amount 8 or the like from the detailed thickness map 6 can be determined, for example, by conducting a test in advance.

In the laser irradiation step (Step S98), based on the correction recipe, the controller 102 performs laser annealing treatment by irradiating the second-main-surface side of the semiconductor substrate 28a with the laser beam by controlling the irradiator 101 to control the laser beam.

It is not necessary to perform Step S95 for all the semiconductor substrates 28 prepared in step S1. For example, for the semiconductor substrate 28 whose thickness is measured in the representative semiconductor substrate thickness measurement step, the individual thickness measurement step may be omitted.

As described above, in the manufacturing method of a semiconductor device of the present embodiment, laser annealing is performed by controlling the laser beam with which the semiconductor substrate 28a is irradiated based on $V(x_2)$ as self-thickness data being the data of the result of measuring the thickness of the semiconductor substrate 28a and the thickness information 5 as reference thickness data being the data as a result of measuring the thickness of at least one semiconductor substrate 28 other than the semiconductor substrate 28a. Accordingly, the manufacturing method of the semiconductor device of the present embodiment is the manufacturing method of the semiconductor device utilizing the feature that there are a plurality of semiconductor substrates to measure the thickness thereof, when measuring the thickness of a plurality of semiconductor substrates upon the laser annealing treatment.

Further, when the second-main-surface side laser annealing step (Step S9) is performed using the laser annealing apparatus 100, the controller 102 controls the laser beam based on the self-thickness data being the result of measuring the thickness of a semiconductor substrate 28a being a certain semiconductor substrate, with a film thickness meter 103 and the reference thickness data being the result of measuring the thickness of at least one semiconductor substrate 28 other than the semiconductor substrate 28a with a film thickness meter 103 at the time of performing the laser annealing treatment on the semiconductor substrate 28. Accordingly, the laser annealing apparatus 100 is a semiconductor manufacturing apparatus suitable for the manufacturing method of the semiconductor device of the present embodiment which is the manufacturing method of the semiconductor device utilizing the feature that there are a plurality of semiconductor substrates to measure the thickness thereof, when measuring the thickness of a plurality of semiconductor substrates upon the laser annealing treatment.

The reference thickness data including the data of the result of the thickness measurement at more positions than the self-thickness data reduces the measurement time in the individual thickness measurement step (Step S95). Compared to the case where detailed thickness measurement is performed for each of the semiconductor substrates 28a, for example, positions and the amount of differences in level based on the element structure provided in the semiconductor element forming region are considered in a short time period based on the reference thickness data. Thereby, preferably, a highly accurate detailed thickness map 6 can be created.

By the above second-main-surface side laser annealing step, the impurities in the impurity injection layer formed in the second-main-surface side impurity injection step are activated, and the semiconductor substrate 28 is in the state illustrated in FIG. 4G.

Returning to FIG. 3, in the second-main-surface side electrode forming step (Step S10), the electrode 20 on the second-main-surface side is formed. As a result, the semiconductor substrate 28 is in the state illustrated in FIG. 4H. The electrode 20 is deposited by, for example, a sputtering device. The material of the electrode 20 is, for example, aluminum.

In the first-main-surface side protective film removing step (Step S11), the protective film 15 on the first-main-surface side of the semiconductor substrate 28 is removed. As a result, the semiconductor substrate 28 is in the state illustrated in FIG. 4I.

In the dicing step (Step S12), the semiconductor substrate 28 is divided into each semiconductor element 40.

Through the above steps, the semiconductor element 40 as a semiconductor device is obtained. However, the target semiconductor device manufactured by the manufacturing method of the semiconductor device of Embodiment 1 may be a semiconductor module in which, for example, a wire is provided on the semiconductor element 40 and sealed with a sealing resin, or a semiconductor device incorporating the above semiconductor module.

<A-3. Effect>

In the manufacturing method of a semiconductor device of the present embodiment, laser annealing is performed by controlling the laser beam with which the semiconductor substrate 28a is irradiated based on $V(x_2)$ as self-thickness data being the data of the result of measuring the thickness of the semiconductor substrate 28a and the thickness information 5 as reference thickness data being the data as a result of measuring the thickness of at least one semiconductor substrate 28 other than the semiconductor substrate 28a. Accordingly, the manufacturing method of the semiconductor device of the present embodiment is the manufacturing method of the semiconductor device utilizing the feature that there are a plurality of semiconductor substrates to measure the thickness thereof, when measuring the thickness of a plurality of semiconductor substrates upon the laser annealing treatment.

The self-thickness data including data of the result of measurement of the thickness of the position selected based on the predetermined standard and the thickness information 5 enables to obtain the information on the thickness of the semiconductor substrate 28a at a more appropriate location to enhance the accuracy of the detailed thickness map 6.

The reference thickness data includes the data of the result of the thickness measurement at many more positions in the plane of the semiconductor substrate 28 than the self-thickness data does. Thereby, preferably, a highly accurate detailed thickness map 6 can be created in shorter time period than in the case where detailed thickness measurement is performed on each of the semiconductor substrates 28a.

At the time of performing the laser annealing treatment on the semiconductor substrate 28, the controller 102 controls the laser beam based on the self-thickness data being the result of measuring the thickness of a semiconductor substrate 28a being a certain semiconductor substrate measured with a film thickness meter 103 and the reference thickness data being the result of measuring the thickness of at least one semiconductor substrate 28 other than the semiconductor substrate 28a measured with the film thickness meter 103. Accordingly, the laser annealing apparatus 100 is a semiconductor manufacturing apparatus suitable for the manufacturing method of the semiconductor device of the present embodiment is the manufacturing method of the semiconductor device utilizing the feature that there are a plurality of semiconductor substrates to measure the thickness thereof, when measuring the thickness of a plurality of semiconductor substrates upon the laser annealing treatment.

B. Embodiment 2

In Embodiment 1, the thickness measurement position in the individual thickness measurement step of Step S95 is preferably a region having high flatness in the semiconductor device forming region in order to improve the accuracy of the detailed thickness map 6. In the manufacturing method of the semiconductor device according to Embodiment 1, the description was made that the measurement position specified in the processing recipe is, for example, a position determined to be flat based on the predetermined standard and the thickness information 5, and in Embodiment 2, an example of the predetermined standard that determines that a position is flat will be described. With respect to other aspects, the manufacturing method of the semiconductor device of Embodiment 2 is the same as the manufacturing method of the semiconductor device of Embodiment 1.

FIG. 2A illustrates an example of the actual thickness distribution 1 of the target semiconductor substrate 28a whose thickness is to be measured in the individual thickness measurement step. The thickness of the semiconductor substrate 28a conceivably varies locally. In the example illustrated in FIG. 2A, the unevenness of the semiconductor element structure formed on the semiconductor first-main-surface side is transferred in the vicinity of $x_4$, and a dent is formed. If the detailed thickness map 6 is created based on the thickness at $x_4$ and the thickness information 5, the deviation of the detailed thickness map 6 with respect to the actual thickness distribution 1 becomes large. Specifying the coordinates $x_3$ that can secure flatness improves the accuracy of the detailed thickness map 6, and the laser annealing treatment under more appropriate conditions is performed.

The predetermined standard for determining flatness is such a standard that, for example, in each semiconductor device forming region, with three consecutive positions in the laser scanning direction dealt as a set among the measurement positions included in the thickness information 5, selects the set with the lowest standard deviation of thickness at 3 positions, and determines, of the three positions in the set with the lowest standard deviation, a position where the thickness is closest to the average value of the thickness of the three positions to be flat. Instead of the standard deviation of the thickness at three positions, a value obtained by dividing the standard deviation of the thickness at three positions by the average value of the thickness at three positions may be used. As in the differences in level 21b generated in the second-main-surface side grinding step described in Embodiment 1, it is considered that unevenness is likely to be formed in the same portions in a plurality of semiconductor substrates 28 produced in the same process, such a standard enables to selects a flatter portion of the semiconductor substrate 28a as a measurement position based on the thickness information 5.

As described above, in Embodiment 2, the self-thickness data of the semiconductor substrate 28a includes data of the result of thickness measurement at a position selected based on the thickness information 5 as the reference thickness data of the semiconductor substrate 28a, in which the selected position is a position determined to be flat based on the predetermined standard and the thickness information 5. Accordingly, the accuracy of the detailed thickness map 6 improves, and the laser annealing treatment under more appropriate conditions is performed. For example, impurities in the impurity injection layer on the second-main-surface side of the semiconductor substrate 28 can be activated more uniformly.

C. Embodiment 3

A manufacturing method of a semiconductor device of Embodiment 3 is a manufacturing method of a semiconductor device, in which a change is made with respect to the manufacturing method of the semiconductor device of Embodiment 1 or 2 in that, in the individual thickness measurement step (Step S95), the thickness is measured at plurality of positions in each semiconductor device formation region, the detailed thickness map 6 is created using the self-thickness data that is the measurement result and the thickness information 5 as reference thickness data, and laser annealing by changing the irradiation conditions of laser beam such as heat input 8. With respect to other aspects, the manufacturing method of the semiconductor device of Embodiment 3 is the same as the manufacturing method of the semiconductor device of Embodiment 1 or 2.

As mentioned in the description of Embodiment 2, the thickness of the target semiconductor substrate 28a for thickness measurement in the individual thickness measurement step (Step S95) conceivably varies locally. Therefore, by measuring the thickness at a plurality of positions within the same semiconductor element forming region, the influence of local variation in the thickness of the semiconductor substrate 28a is reduced, and laser annealing treatment under more suitable irradiation conditions is performed. Accordingly, impurities in the impurity injection layer formed in the second-main-surface side impurity injection step can be activated more uniformly, for example.

For example, at the coordinates $x_4$ illustrated in FIG. 2A, the thickness is locally thin; therefore, if a detailed thickness map 6 is created using the thickness at $x_4$, the deviation with respect to the actual thickness distribution 1 occurs. Therefore, by adding, for example, $x_2$ as a measurement position within the same semiconductor element forming region, the influence of local variation in the thickness of the semiconductor substrate 28a can be reduced. The detailed thickness map 6 is obtained by adjusting the thickness information 5 by a constant part in a manner that, for example, the average thickness of the detailed thickness map 6 at a plurality of positions to be measured in the individual thickness measurement step matches the average thickness at a plurality of positions of the measurement target measured in the individual thickness measurement step. $U(x_i)$, representing the thickness at each position $x_i$ indicated by the detailed thickness map 6, is obtained with, for example, $U(x_i)=W(x_i)+(-W(x_2)-W(x_4)+V(x_2)+V(x_4))/2$, in which $V(x_2)$ and $V(x_4)$ represent the thickness at $x_2$ and $x_4$ measured in the individual thickness measurement step, and $W(x_i)$ represents the thickness at each position $x_i$ indicated by the thickness information 5.

When combining the configuration of Embodiment 3 with the configuration of Embodiment 2, the thickness is measured at a plurality of positions selected in order from the position with the highest flatness in each of the semiconductor element forming regions in the individual thickness measurement step (Step S95). For flatness, for example, in each semiconductor device forming region, with three consecutive positions in the laser beam scanning direction dealt as a set among the measurement positions included in the reference thickness data, it is determined that the position where the thickness is closest to the average value of the thickness of the three positions has higher flatness when standard deviation of thickness at three positions is lower. By selecting a plurality of positions determined to have high flatness and measuring the thickness in the individual thickness measurement step (Step S95), the influence of local variation in the thickness in the plane can be further suppressed, which enables to create the detailed thickness map 6 even closer to the actual thickness distribution 1.

D. Embodiment 4

A manufacturing method of a semiconductor device of Embodiment 4 is a manufacturing method of a semiconductor device according to any one of Embodiments 1 to 3, which is a manufacturing method of a semiconductor device that performs laser annealing treatment of laser irradiation step (Step S98) by controlling the laser beam based on the heat capacity of the electrode 15 and the protective film 15.

When the laser irradiation step (Step S98) is executed, the electrode 12 and the protective film 15 which is a film covering the electrode 12 are provided on the first-main-surface side of the semiconductor substrate 28a. By reflecting the heat capacity of the electrode 12 and the protective film 15 in the laser irradiation conditions such as the heat input amount, the laser annealing treatment can be performed under more suitable irradiation conditions, in addition to the variation in the thickness of semiconductor substrate 28, even in a case where the semiconductor substrate 28 is ground to a thickness where the influence of the heat capacity of the electrodes 12 and the protective film 15 formed on the first-main-surface side of the semiconductor substrate cannot be ignored in the second-main-surface side grinding step of Step S6 illustrated in the flowchart of FIG. 3. Accordingly, impurities in the impurity injection layer formed in the second-main-surface side impurity injection step can be activated more uniformly, for example.

In order to take the heat capacity of the electrode 12 and the protective film 15 into consideration, the film thicknesses of the electrode 12 and the protective film 15 formed on the semiconductor substrate 28 are measured in advance. For example, a method is conceivable to adopt, in which, regarding the heat capacity, the film thicknesses of the electrode 12 and the protective film 15 are measured with a fluorescent X-ray device, the heat capacity and the corresponding corrected heat input amount are calculated based on the physical property values of each material, and they are reflected in the correction recipe. As with the thickness of the semiconductor substrate 28, the film thicknesses of the electrode 12 and the protective film 15 may be obtained by, for each substrate, measuring the thickness at one or more positions in the region of each semiconductor element 40, and complementing by combining more detailed film thickness distributions in the substrate surface of the electrodes 12 and protective film 15 measured on a representative substrate.

As described above, in the manufacturing method of the semiconductor device of Embodiment 4, the film thicknesses of the electrode 12 and the protective film 15 are measured, and the laser annealing is performed by controlling the laser beam based on the data of the measurement results of the film thicknesses of the electrode 12 and the protective film 15. As a result, the laser annealing treatment can be performed under more suitable irradiation conditions.

E. Embodiment 5

A manufacturing method of a semiconductor device of Embodiment 5 is a method in which, in addition to the above-described Embodiments 1 to 4, the laser beam is controlled based on the element structures in the laser annealing treatment of the laser irradiation step (Step S98) for the semiconductor substrate 28 on which a plurality of element structures are formed. With respect to other aspects, the manufacturing method of the semiconductor device of Embodiment 5 is the same as the manufacturing method of any of the semiconductor device of Embodiment 1 to 4.

Figure 7:
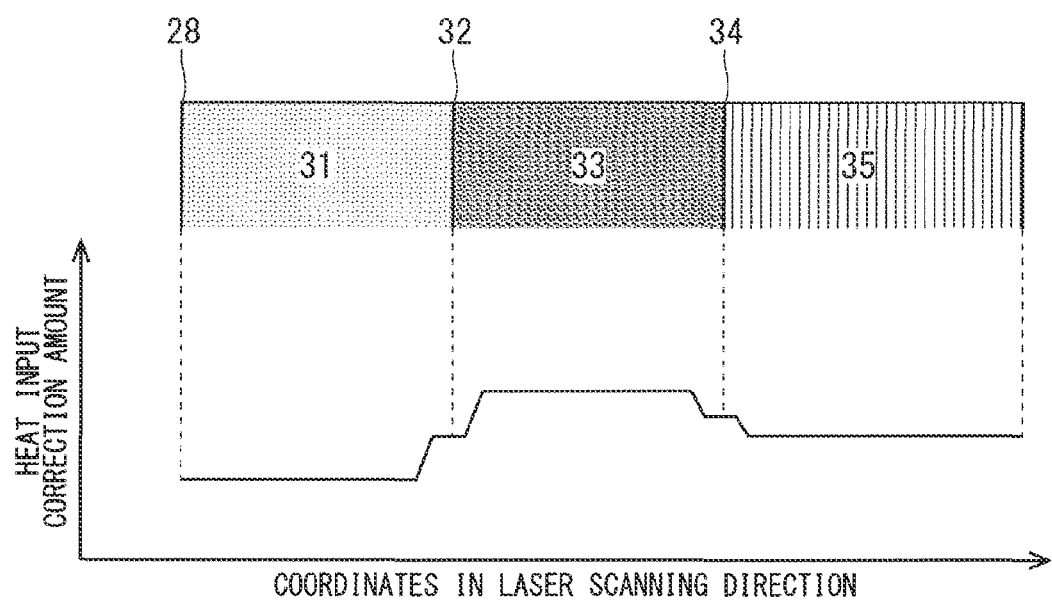
FIG. 7 is a diagram schematically illustrating the relationship between an element structure of a semiconductor substrate and the heat input correction amount in the laser annealing treatment.

FIG. 7 illustrates each of a diode region 31, an IGBT region 33, and a termination region 35 in cross section illustrated with line A-A in FIG. 1, and a heat input correction amount, which is the correction to the heat input amount in each region in the laser irradiation step (Step S98). The diode region 31 is a region corresponding to the cathode layer 17 in FIG. 4G in plan view, and the IGBT region 33 is a region corresponding to the buffer layer 18 and the collector layer 19 in FIG. 4G in plan view.

As illustrated in FIG. 7, each of the semiconductor substrates 28 is provided with a plurality of element structures of the diode region 31, the IGBT region 33, and the terminal region 35 in each of the semiconductor element forming regions.

In Embodiment 5, in addition to the above-described Embodiments 1 to 4, the semiconductor substrate 28 is arranged on the stage 29 such that a plurality of element structures are arranged in the scanning direction of the laser beam, and the annealing treatment of the laser irradiation step (Step S98) is performed.

In Embodiment 5, the controller 102 performs the laser annealing treatment by controlling the laser beam based on which element structure is an element structure in the region to be irradiated with the laser beam among the plurality of element structures, in addition to the control of laser beam based on the thickness of the semiconductor substrate 28 and the film thicknesses of the electrode 12 and the protective film 15 in Embodiments 1 to 4.

In order to make each region of the diode region 31, the IGBT region 33, the terminal region 35 and boundary regions 32 and 34 thereof into a desired diffusion structure, the heat input amount in the laser annealing treatment obtained in the correction recipe creating step (Step S97) of Embodiment 5 is adopted, which is obtained by adding the heat input correction amount illustrated in FIG. 7 to the heat input amount in the laser annealing treatment determined in the correction recipe creating steps (Step S97) of Embodiments 1 to 4, for example. FIG. 7 illustrates the case where the heat input correction amount in the boundary regions 32 and 34 is about the middle level of the heat input correction amount in the regions on both sides thereof; however, the heat input correction amount in the boundary regions 32 and 34 can be higher or lower than this middle level.

By controlling the laser beam based on which element structure is an element structure in the region to be irradiated with the laser beam among the plurality of element structures, the laser annealing treatment under irradiation conditions more suitable for each element structure is performed.

F. Embodiment 6

In Embodiments 1 to 5, the description was made on the manufacturing method of the semiconductor device of each Embodiment assuming that the case of forming a diffusion layer by the laser annealing treatment after the ion implantation step after grinding the second-main-surface side of the semiconductor substrate; however, the annealing treatment may be utilized for crystallization of amorphous film provided on semiconductor substrate and for Ohmic electrode forming step after formation of the second-main-surface side electrode of semiconductor substrate. Further, for example, when used in the Ohmic electrode forming step, this enables to take not only the thickness of the semiconductor substrate 28 but also the thickness of the electrode into consideration.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a semiconductor device, comprising:
preparing a plurality of semiconductor substrates; and
for each of at least one semiconductor substrate of the plurality of semiconductor substrates, performing a laser annealing treatment by controlling a laser beam irradiating the semiconductor substrate based on self-thickness data being data of a result of measurement of a thickness of the semiconductor substrate and reference thickness data being data of a result of measurement of a thickness of at least one semiconductor substrate other than the semiconductor substrate among the plurality of semiconductor substrates,
wherein the self-thickness data includes data of a result of measurement of the thickness at a position selected which is determined to be flat.

2. The manufacturing method of the semiconductor device according to claim 1, wherein
the self-thickness data includes the data of the result of measurement of the thickness at the position selected based on the reference thickness data.

3. The manufacturing method of the semiconductor device according to claim 2, wherein
the selected position is determined to be flat based on a predetermined standard and the reference thickness data.

4. The manufacturing method of the semiconductor device according to claim 1, wherein
each of the semiconductor substrates has at least one semiconductor element forming region in which a semiconductor element is formed,
the self-thickness data includes data of a result of measurement of thicknesses at a plurality of positions of each of the at least one semiconductor element forming region.

5. The manufacturing method of the semiconductor device according to claim 1, wherein
the reference thickness data includes data of a result of measurement of thicknesses at many more positions in a plane of the at least one of the semiconductor substrate other than the semiconductor substrate than the self-thickness data.

6. The manufacturing method of the semiconductor device according to claim 1, wherein
each of the semiconductor substrates has at least one semiconductor element forming region each of which is provided with a plurality of element structures,
the semiconductor substrate is arranged so that the plurality of element structures are arranged in the scanning direction of the laser beam, and
the laser annealing treatment is performed by controlling the laser beam based on which element structure is an element structure in a region to be irradiated with the laser beam among the plurality of element structures.

7. The manufacturing method of the semiconductor device according to claim 1, wherein
an electrode is provided on a main surface side being one side of the plurality of semiconductor substrates, the manufacturing method comprising:
measuring a film thickness of the electrode; and
performing the laser annealing treatment by controlling the laser beam based on data of a result of the measuring of the film thickness of the electrode.

8. The manufacturing method of the semiconductor device according to claim 7, wherein
a film covering the electrode is provided on the main surface side being the one side of the plurality of semiconductor substrates, the manufacturing method comprising:
measuring a film thickness of the film; and
performing the laser annealing treatment by controlling the laser beam based on data of a result of the measuring of the film thickness of the film.

9. A manufacturing method of a semiconductor device comprising:
preparing a plurality of semiconductor substrates; and
for each of at least one semiconductor substrate of the plurality of semiconductor substrates, performing a laser annealing treatment by controlling a laser beam irradiating the semiconductor substrate based on self-thickness data being data of a result of measurement of a thickness of the semiconductor substrate and reference thickness data being data of a result of measurement of a thickness of at least one semiconductor substrate other than the semiconductor substrate among the plurality of semiconductor substrates, wherein the self-thickness data includes data of a result of measurement of the thickness at a position selected based on the reference thickness data, each of the semiconductor substrates has at least one semiconductor element forming region in which a semiconductor element is formed, the selected position includes a position selected in an order of highness in flatness from positions in each of the at least one of the semiconductor element forming regions, and for flatness, in each of the at least one of the semiconductor element forming regions, when standard deviation of thickness at three consecutive measurement positions in a scanning direction of the laser beam in the reference thickness data is smaller, of the three measurement positions, a position having a thickness closest to an average value of thicknesses of the three measurement positions is determined to have high flatness.

10. A semiconductor manufacturing apparatus configured to perform a laser annealing treatment on a semiconductor substrate, comprising:

a stage configured to hold the semiconductor substrate;

an irradiator configured to irradiate the semiconductor substrate held on the stage with a laser beam;

a measuring unit configured to measure a thickness of the semiconductor substrate; and a controller configured to control the irradiator, wherein the controller controls the laser beam based on the self-thickness data being a result of measurement of the thickness of the semiconductor substrate measured with the measuring unit and the reference thickness data being a result of measurement of the thickness of at least one semiconductor substrate other than the semiconductor substrate measured with the measuring unit at a time of performing the laser annealing treatment on the semiconductor substrate, and the self-thickness data includes data of a result of measurement of the thickness at a position selected which is determined to be flat.

11. The semiconductor manufacturing apparatus according to claim 10, wherein the self-thickness data includes data as a result of the measurement of a thickness at a position selected by the controller based on the reference thickness data.

12. The semiconductor manufacturing apparatus according to claim 10, wherein the self-thickness data includes the data of the result of measurement of the thickness at the position selected based on the reference thickness data.

13. The semiconductor manufacturing apparatus according to claim 12, wherein the selected position is determined to be flat based on a predetermined standard and the reference thickness data.

14. A manufacturing method of a semiconductor device, comprising:

preparing a plurality of semiconductor substrates; and for each of at least one semiconductor substrate of the plurality of semiconductor substrates, performing a laser annealing treatment by controlling a laser beam irradiating the semiconductor substrate based on self-thickness data being data of a result of measurement of a thickness of the semiconductor substrate and reference thickness data being data of a result of measurement of a thickness of at least one semiconductor substrate other than the semiconductor substrate among the plurality of semiconductor substrates, wherein the reference thickness data includes data of a result of measurement of thicknesses at many more positions in a plane of the at least one of the semiconductor substrate other than the semiconductor substrate than the self-thickness data.

15. A manufacturing method of a semiconductor device, comprising:

preparing a plurality of semiconductor substrates; and for each of at least one semiconductor substrate of the plurality of semiconductor substrates, performing a laser annealing treatment by controlling a laser beam irradiating the semiconductor substrate based on self-thickness data being data of a result of measurement of a thickness of the semiconductor substrate and reference thickness data being data of a result of measurement of a thickness of at least one semiconductor substrate other than the semiconductor substrate among the plurality of semiconductor substrates, wherein each of the semiconductor substrates has at least one semiconductor element forming region each of which is provided with a plurality of element structures, the semiconductor substrate is arranged so that the plurality of element structures are arranged in the scanning direction of the laser beam, and the laser annealing treatment is performed by controlling the laser beam based on which element structure is an element structure in a region to be irradiated with the laser beam among the plurality of element structures.

16. A manufacturing method of a semiconductor device, comprising:

preparing a plurality of semiconductor substrates; and for each of at least one semiconductor substrate of the plurality of semiconductor substrates, performing a laser annealing treatment by controlling a laser beam irradiating the semiconductor substrate based on self-thickness data being data of a result of measurement of a thickness of the semiconductor substrate and reference thickness data being data of a result of measurement of a thickness of at least one semiconductor substrate other than the semiconductor substrate among the plurality of semiconductor substrates, wherein an electrode is provided on a main surface side being one side of the plurality of semiconductor substrates, the manufacturing method comprising:

measuring a film thickness of the electrode; and performing the laser annealing treatment by controlling the laser beam based on data of a result of the measuring of the film thickness of the electrode.

17. The manufacturing method of the semiconductor device according to claim 16, wherein a film covering the electrode is provided on the main surface side being the one side of the plurality of semiconductor substrates, the manufacturing method comprising:

measuring a film thickness of the film; and performing the laser annealing treatment by controlling the laser beam based on data of a result of the measuring of the film thickness of the film.

* * * * *